(12) United States Patent
Tsui et al.

(10) Patent No.: US 7,939,400 B2
(45) Date of Patent: May 10, 2011

(54) SYSTEMS AND METHODS THAT SELECTIVELY MODIFY LINER INDUCED STRESS

(75) Inventors: Ting Tsui, Garland, TX (US); Satyavolu S. Papa Rao, Garland, TX (US); Haowen Bu, Plano, TX (US); Robert Kraft, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 121 days.

(21) Appl. No.: 12/235,766

(22) Filed: Sep. 23, 2008

(65) Prior Publication Data

US 2009/0017588 A1 Jan. 15, 2009

Related U.S. Application Data

(62) Division of application No. 11/049,275, filed on Feb. 2, 2005, now Pat. No. 7,442,597.

(51) Int. Cl.
*H01L 21/8238* (2006.01)

(52) U.S. Cl. ........ 438/199; 438/200; 438/204; 438/201; 257/E21.632

(58) Field of Classification Search .................. 438/199, 438/200, 204, 201; 257/E21.632
See application file for complete search history.

(56) References Cited

U.S. PATENT DOCUMENTS

| | | | |
|---|---|---|---|
| 6,100,166 A | 8/2000 | Sakaguchi et al. | |
| 6,316,302 B1 * | 11/2001 | Cheek et al. | 438/199 |
| 6,573,172 B1 * | 6/2003 | En et al. | 438/626 |
| 6,815,823 B2 | 11/2004 | Teh et al. | |
| 7,112,495 B2 * | 9/2006 | Ko et al. | 438/300 |
| 7,220,630 B2 * | 5/2007 | Cheng et al. | 438/199 |
| 7,227,205 B2 | 6/2007 | Bryant et al. | |
| 2004/0159834 A1 | 8/2004 | Huang et al. | |
| 2006/0145264 A1 | 7/2006 | Chidambarrao et al. | |

OTHER PUBLICATIONS

"A Novel Strain Enhanced CMOS Architecture Using Selectively Deposited High Tensile and High Compressive Silicon Nitride Films", S. Pidin, T. Mori, K. Inque, S. Fukuta, N. Itoh, E. Mutoh, K. Ohkoshi, R. Nakamura, K. Kobayashi, K. Kawamura, T. Saiki, S. Fukuyama, S. Satoh, M. Kase and K. Hashimoto, IEEE, 2004, 4 pgs.
"Technology Booster using Strain-Enhancing Laminated SiN (SELS) for 65 nm Node HP MPUs", K. Goto, S. Satoh, K. Ohta, S. Fukuta, T. Yamamoto, T. Mori, Y. Tagawa, T. Sakuma, T. Saiki, Y. Shimamune, A. Katakami, A. Hatada, H. Morioka, Y. Hayami, S. Inagaki, K. Kawamura, Y. Kim, H. Kokura, N. Tamura, N. Horiguchi, M. Kojima, T. Sugii and K. Hashimoto, IEEE 2004, 4 pgs.
"Local Mechanical-Stress Control (LMC): A New Technique for CMOS-Performance Enhancement", A Shimizu, K. Hachimine, N. Ohki, H Ohta, M. Koguchi, Y. Nonaka, H. Sato and F. Ootsuka, IEEE, 2001, 4 pgs.

* cited by examiner

*Primary Examiner* — Luan C Thai
(74) *Attorney, Agent, or Firm* — John J. Patti; Wade J. Brady, III; Frederick J. Telecky, Jr.

(57) ABSTRACT

The present invention facilitates semiconductor fabrication by providing methods of fabrication that selectively apply strain to multiple regions of a semiconductor device. A semiconductor device having one or more regions is provided (102). A strain inducing liner is formed over the semiconductor device (104). A selection mechanism, such as a layer of photoresist or UV reflective coating is applied to the semiconductor device to select a region (106). The selected region is treated with a stress altering treatment that alters a type and/or magnitude of stress produced by the selected region (108).

9 Claims, 8 Drawing Sheets

FIG. 6 though it is not intended that the invention be limited in this respect. The term "exemplary" is used herein to mean serving as an example, instance, or illustration. Any aspect or design described herein as "exemplary" is not necessarily to be construed as preferred or advantageous over other aspects or designs.

SYSTEMS AND METHODS THAT SELECTIVELY MODIFY LINER INDUCED STRESS

DIVISIONAL APPLICATION

This application is a Divisional of and claims priority under 35 U.S.C. 120 to application Ser. No. 11/049,275 filed Feb. 2, 2005 and incorporated herein by reference.

FIELD OF INVENTION

The present invention relates generally to semiconductor devices and more particularly to transistor devices and associated methods of manufacture having improved mobility due to channel strain by selectively modifying liner stress.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), an dielectric layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to a mobility of carriers in the channel. Thus the higher the mobility of the carriers in the channel, the more current can flow and the faster a circuit can perform when using high mobility MOS transistors. One mechanism to increase the mobility of the carriers in the channel of an MOS transistor is to produce a mechanical stress or strain in the channel.

A compressive strained channel typically provides hole mobility enhancement, which is particularly beneficial for PMOS devices, whereas a tensile strained channel typically provides electron mobility enhancement, which is particularly beneficial for NMOS devices. However, the tensile strain that improves electron mobility can also degrade hole mobility. As a result, introducing tensile strain to channel regions can improve performance of NMOS devices but degrade performance of PMOS devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by selectively applying types and amounts of stress to one or more regions of a semiconductor device. Different transistor devices react to induced stress differently, sometimes negatively, according to type and magnitude of induced stress. By selectively applying types and amounts of stress to one or more regions of a semiconductor device, channel mobility for multiple regions can be improved, thereby facilitating device operation and performance.

The present invention employs a strain inducing liner that covers a semiconductor device. The strain inducing liner can induce a type of stress, such as compressive or tensile, and a magnitude of stress without further alteration. A selection mechanism, such as a resist layer, is employed to select a region of the device. The selected region is then treated so as to alter the type of stress and/or magnitude of stress induced the by strain inducing liner within the selected region. The stress inducing treatment can be performed at an appropriate temperature that, in addition to altering the type of stress and/or magnitude of stress, causes the liner to induce the stress. Alternately, a separate thermal process or curing process can then be performed that causes stress to be induced by the strain inducing liner. Other systems and methods are disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale.

The present invention facilitates semiconductor fabrication by selectively applying types and amounts of stress to one or more regions of a semiconductor device. Different transistor devices react to induced stress differently, sometimes negatively, according to type and magnitude of induced stress. By selectively applying types and amounts of stress to one or more regions of a semiconductor device, channel mobility for multiple regions can be improved, thereby facilitating device operation and performance.

One conventional mechanism employed to improve carrier mobility is to employ a layer to induce stress or strain to channel regions of transistor devices. A single layer is formed over a device and subjected to a thermal process, which can induce stress to channel regions of the device. However, semiconductors typically contain multiple types of devices that may not all respond positively to the induced stress. Some devices may have their performance degraded as a result of the stress. The inventors of the present invention note that, for example, the induced tensile stress improves electron mobility and, therefore, performance of NMOS devices, but degrades hole mobility and, therefore, performance of PMOS devices.

One mechanism that can be employed is to form a single layer that induces stress over a device and physically remove a portion of that layer from a PMOS region. However, channel mobility, in this example, is only improved within the NMOS region and extra processing steps are required to remove the layer from the PMOS region.

The present invention employs a single strain/stress inducing layer, but follows with a selective stress altering treatment that permits different stress types and amounts to be applied to multiple regions. As a result, degradation resulting from induced stress can be mitigated and performance for multiple device types (e.g., NMOS and PMOS) can be improved by a single layer.

Figure 1:
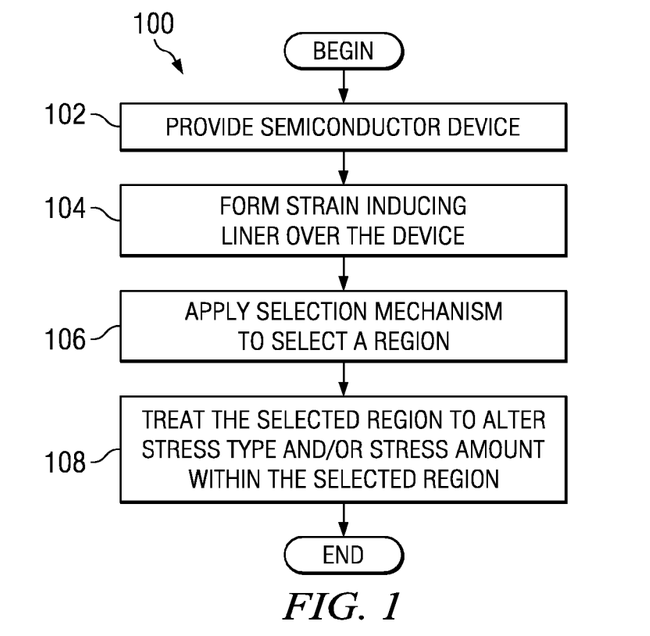
FIG. 1 is a flow diagram illustrating a method of fabricating a semiconductor device that employs a selection mechanism and a stress alteration treatment in accordance with an aspect of the present invention.

FIG. 1 is a flow diagram illustrating a method 100 of fabricating a semiconductor device that employs a selection mechanism and a stress alteration treatment in accordance with an aspect of the present invention. As a result, induced strain can be controlled and employed to selectively facilitate device operation.

The method 100 begins at block 102 wherein a semiconductor device is provided. Generally, structures such as source/drain regions, gate structures, sidewall spacers, well regions, channel regions, and the like are formed and/or defined on or within the semiconductor device.

A strain inducing liner is then formed over/on the device at block 104. The strain inducing liner comprises a strain inducing material, such as silicon nitride (SiN), silicon carbide (SiCN), silicon carbon (SiC), silicon oxy-carbine (SiOC), and the like. The strain inducing liner, as formed, has a stress type (tensile or compressive) and a magnitude or magnitude. For example, a liner comprised of silicon nitride generally creates a compressive stress inducing liner whereas a silicon carbide liner generally creates a tensile stress inducing liner. It is also appreciated that the strain inducing liner should be formed relatively close to channel regions of the device in order to induce stress into those channel regions.

A selection mechanism is applied to select a region of the device at block 106. The selection mechanism can comprise a lithographic layer such as a resist mask, ultraviolet reflective coating, and the like so as to permit treatment of the selected region and substantially prevent treatment of non-selected portions of the device.

If a resist layer is employed as a selection mechanism, some thermal regimes can preclude exposure of the resist during the stress altering treatment applied below. In such a case, another coating, such as UV-reflective/e-beam blocking coatings can be employed by etching and removing the resist layer. Subsequently, the UV-reflective/e-beam blocking coating can be removed. Additionally, the selection mechanism can also include a direct write electron beam mechanism wherein the application of the electron beam is controlled.

A stress altering treatment is applied to the selected region at block 108. The stress altering treatment modifies the stress type and/or stress magnitude of the strain inducing liner within the selected region. As a result, stress of a first type and magnitude can be applied outside the region and stress of a second type and magnitude can be applied within the selected region. Thus, carrier mobility and device performance can be enhanced in multiple regions or portions of the device utilizing the same layer. The treatment process can be carried out at an appropriate temperature, or subsequently, a thermal process or cure can be performed that causes the final stress to be established in the treated region.

One suitable mechanism of altering stress within the selected region at block 108 is to use an ultra-violet beam in a blanket process. The selection mechanism from block 106 prevents the ultra-violet beam from altering stress characteristics in non-selected portions of the device, but permits the ultra-violate beam to alter stress characteristics within the selected region. Another suitable mechanism of altering stress within the selected region at block 108 is to use an electron beam in a blanket operation. The selection mechanism from block 106 prevents the electron beam from altering stress characteristics in non-selected portions of the device, but permits the electron beam to alter stress characteristics within the selected region. It is appreciated that this procedure can be repeated should multiple levels of stress (e.g., magnitude 1 for one group of NMOS and magnitude 2 for a second group of NMOS transistors, and likewise for PMOS transistors) be required. Yet another suitable mechanism of altering stress within the selected region at block 108 is to employ an electron beam in a direct write mode, which allows the electron beam to only be applied to the selected region. In the direct write case, the dwell time of the electron beam can be varied, if desired, to create multiple levels of stress (e.g., magnitude 1 for one group of NMOS transistors and magnitude 2 for a second group of NMOS transistors, and likewise for PMOS transistors).

Figure 2:
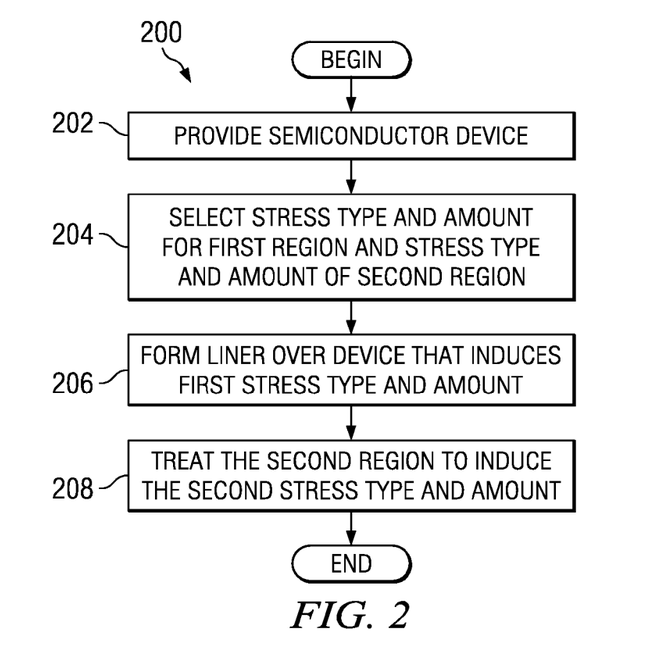
FIG. 2 is a flow diagram illustrating a method of fabricating a semiconductor device wherein stress types and amounts are selected and applied to multiple regions.

FIG. 2 is a flow diagram illustrating a method 200 of fabricating a semiconductor device wherein stress types and magnitudes are selected and applied to multiple regions. A strain inducing liner followed by a stress altering treatment are employed to obtain the selected stress types and magnitudes.

The method 200 begins at block 202, wherein a semiconductor device is provided. Generally, structures such as source/drain regions, gate structures, sidewall spacers, well regions, channel regions, and the like are formed and/or defined on or within the semiconductor device.

A stress type and its magnitude are selected for a first region and another stress type and magnitude are selected for a second region at block 204. The stress types are either compressive or tensile and are usually different, but not always, for the first and second regions. It is noted that a compressive strained channel typically provides hole mobility enhancement, which is particularly beneficial for PMOS devices, whereas a tensile strained channel typically provides electron mobility enhancement, which is particularly beneficial for NMOS devices. As a result, if the first region is a PMOS region and the second region is an NMOS region, the first type of stress is typically compressive stress whereas the second type of stress is typically tensile stress. The stress magnitude is also generally a function of transistor devices formed within the regions. Typically, the greater the stress, the greater the improvement in carrier mobility obtained, so long as the stress type is appropriate. If the stress magnitude is too great though, the device can be damaged. It is also appreciated that individual device geometries can require different stress levels.

A stress inducing liner is formed over/on the device that induces the selected stress type and magnitude for the first region at block 206. The composition of the liner, including flow rates and the like employed in formation of the liner, is a function of the selected stress type and stress magnitude for the first region. For example, silicon nitride can be formed so as to yield a compressive stress inducing liner. Alternately, silicon carbide can be formed to yield a tensile stress inducing liner. Generally, the liner should be formed within a close proximity to channel regions of transistor devices within the first and second regions in order to effectively transmit stress to the channel region and impact carrier mobility.

Continuing the method 200, a stress altering treatment is applied to the second region at block 208 to induce the second stress type and magnitude within the second region. A number of suitable stress altering treatments, including but not limited to ultraviolet blanket operations, electron beam blanket operations, direct write electron beam operations, and the like, can be employed to alter the stress type and magnitude within the second region. A number of factors, including duration of treatment, intensity of treatment, composition of the liner layer, selection mechanism, and the like are employed in performing the stress altering treatment in order to obtain the selected second type and magnitude of stress.

As a result, the first region has the first stress type and stress magnitude induced by an untreated portion of the stress inducing liner and the second region has the second stress type and stress magnitude induced by a treated portion of the stress inducing liner. It is appreciated that the present invention contemplates selection of additional stress type and magnitude for additional regions and performing additional stress altering treatments in order to obtain the additional selected stress types and amounts for those additional regions.

Figure 3:
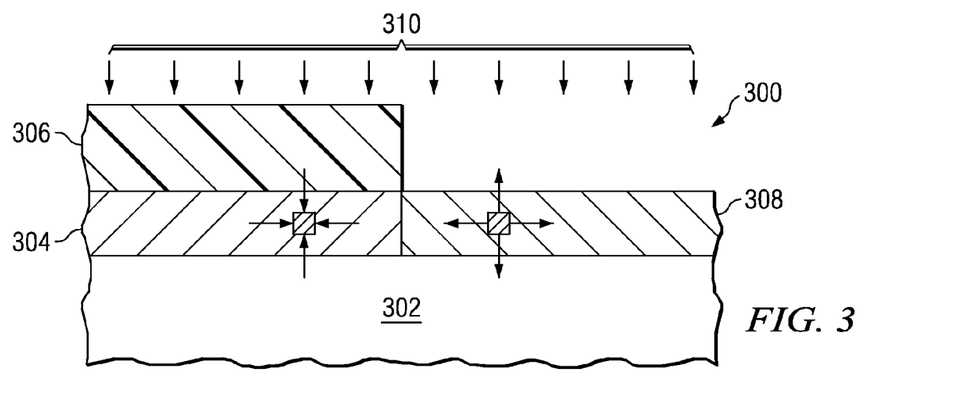
FIG. 3 is a diagram illustrating a cross sectional view of a semiconductor device undergoing a stress altering treatment in accordance with an aspect of the present invention.

FIG. 3 is a diagram illustrating a cross sectional view of a semiconductor device 300 undergoing a stress altering treatment in accordance with an aspect of the present invention. The view is exemplary in nature and is provided as an example to facilitate a better understanding of the present invention.

The device 300 includes a silicon semiconductor layer 302, which may be a channel region of a transistor device within the semiconductor device. A stress inducing liner 304 and 308 is formed on the silicon layer 302 and is comprised of silicon nitride in this example. Untreated, the stress inducing liner 304 and 308 yields a compressive strain inducing portion 304 as a result of the composition of the silicon nitride. Additional factors, such as gas flow rates, temperature, duration, and the like also relate to the magnitude of stress induced by the stress inducing liner 304 and 308, particularly with respect to the untreated portion 304. A lithographic process results in a coating 306, such as photo resist or an ultraviolet reflective coating, which also includes an etch process. The coating 306 masks the untreated portion 304 to prevent treatment and prevent alteration of stress induced by the untreated portion 304.

A blanket stress inducing treatment 310, such as an ultraviolet or electron beam (under blanket operation) is employed to alter stress properties of the treated portion 308 of the stress inducing liner 304 and 308. The stress treatment 310 is applied with a duration and dose that alters the stress properties of the treated portion 308 in order to obtain selected stress type, which is tensile in this example, and stress magnitude. For the device 300, the higher the dose and duration, generally, the higher the stress magnitude in the treated portion 308.

Figure 4:
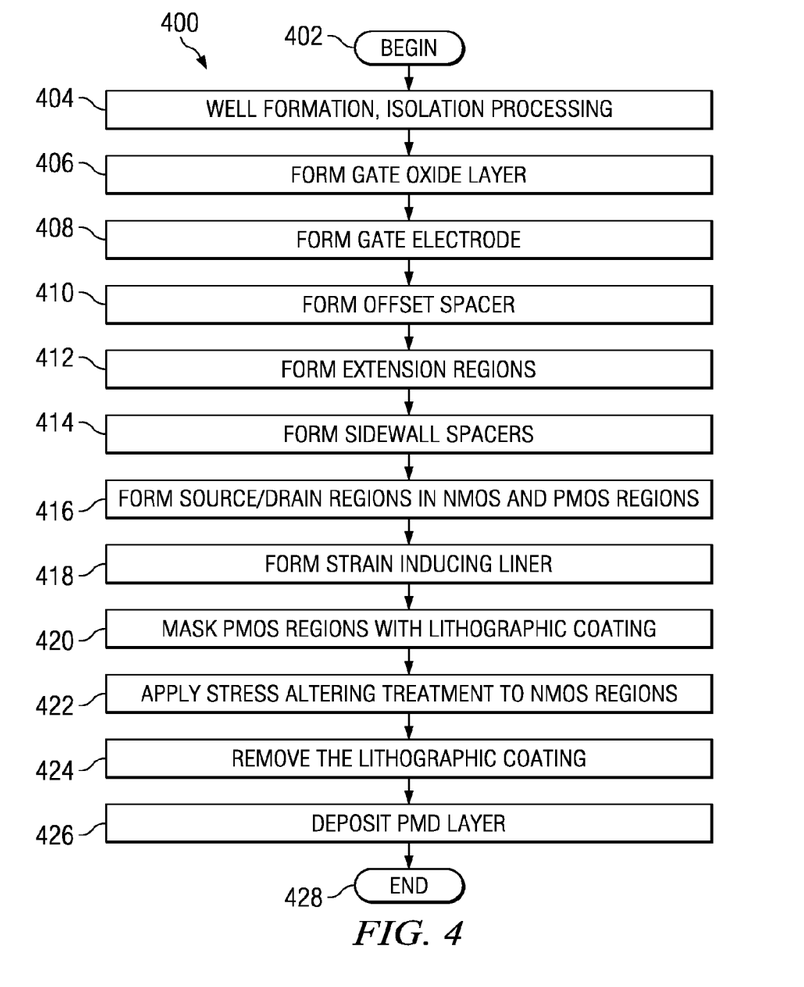
FIG. 4 is a flow diagram illustrating a method of fabricating a semiconductor device that selectively applies tensile strain to an NMOS region and compressive strain to a PMOS region in accordance with an aspect of the present invention.

FIG. 4 is a flow diagram illustrating a method 400 of fabricating a semiconductor device that selectively applies tensile strain to an NMOS region and compressive strain to a PMOS region in accordance with an aspect of the present invention. While the exemplary method 400 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 400 begins at block 402, wherein transistor fabrication is initiated, and transistor well formation and isolation processing is performed at block 404 thereby defining NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 400 continues at block 406, wherein a gate oxide layer is formed in active areas defined by the various formed isolation regions. In one example, the gate oxide comprises a thin, thermally grown silicon dioxide layer, however, other type gate dielectrics (such as silicon oxy-nitrides and high-k dielectrics) may be formed and are contemplated by the present invention. A conductive gate layer is then deposited over the gate oxide at block 408 and patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at block 410. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at block 412 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 4, sidewall spacers are then formed on the gate structures at block 414. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the NMOS and PMOS regions at block 416. Source/drain regions are formed within the NMOS region by masking the PMOS region with a resist mask, exposing the NMOS region, and implanting n-type dopants (e.g., phosphorous). Similarly, source/drain regions are formed within the PMOS region by masking the NMOS region with a resist mask, exposing the PMOS region, and implanting p-type dopants (e.g., boron). The source/drain dopant is introduced into the exposed areas (top of gate electrode and active areas not covered by the sidewall spacers).

A strain inducing liner is formed over the device at block 418. The strain inducing liner is comprised of one or more layers that induce strain. A composition and thickness of layers comprising the strain inducing liner are selected to attain a desired magnitude and type of strain as well as protect underlying layers/regions of the device. The liner also serves to protect and facilitate formation of a later formed PMD layer. Generally, the liner formed at block 418 is a compressive stress inducing liner.

Some examples of suitable strain inducing liner compositions include, silicon nitride (SiN), silicon carbide (SiCN), silicon carbon (SiC), silicon oxy-carbide (SiCO), and the like. The formation of the strain inducing liner can control the magnitude and type of stress produced. For example, a compressive stress inducing silicon nitride based liner can be obtained by forming the silicon nitride in a chamber by a plasma enhanced chemical vapor deposition (PECVD) process with a temperature of about 300 to 450 degrees Celsius, a pressure of about 2.0 to 2.5 torr, a $SiH_4$ flow of about 20 sccm, an $NH_3$ flow of about 500 sccm, an $N_2$ flow of about 2000 sccm, a high frequency RF power of about 20 watts and a lower frequency RF power of about 50 watts. As another example, a tensile stress inducing silicon nitride based liner can be obtained by forming the silicon nitride with a temperature of about 300 to 450 degrees Celsius, a pressure of about 4.0 to 6.0 torr, a $SiH_4$ flow of about 100 sccm, an $NH_3$ flow of about 3000 sccm, an $N_2$ flow of about 2000 sccm, a high frequency RF power of about 50 watts and a lower frequency RF power of about 15 watts. It is noted that the above examples are provided for illustrative purposes and that the present invention contemplates other formation parameter/factor values.

Silicon carbide and silicon cobalt based liners are generally formed as compressive strain inducing liners. An exemplary nitrogen doped silicon carbide based liner is obtained by forming the liner within a chamber with a temperature of about 350 degrees Celsius, a pressure of about 3.0 torr, a tri-methylsilane flow of about 160 sccm, an $NH_3$ flow of about 325 sccm, an He flow of about 400 sccm, and an RF power of about 300.

Continuing the method 400, the PMOS region is masked with a lithographic coating at block 420 whereas the NMOS region is exposed. The lithographic coating is typically a photosensitive and developable material that can substantially absorb or reflect electron and/or ultraviolet beams. Suitable lithographic coatings include, for example, photo resist and UV reflective coatings. It is appreciated that alternate methods of the present invention include other coatings selectively formed that block stress inducing treatments. For example, a thin metal layer can be formed over the device and patterned, and etched to expose one or more regions to treat. Subsequently, the thin metal layer can be removed.

A stress altering treatment is applied to the NMOS region at block 422, which alters the portion of the liner within the NMOS region causing the stress type and/or magnitude to be altered. The strain inducing liner within the PMOS region is not altered because of the PMOS region being masked. The stress altering treatment is typically an electron or ultraviolet beam blanket operation. Parameters for performing the treatment include dose, duration, temperature, and the like and are adjusted according to the stress type and/or magnitude to be obtained. The temperature and duration can be selected so as to alter the stress and cause the strain inducing liner to induce stress into channel regions of the device. As a result, a separate thermal or curing step can be avoided. It is also noted that if an electron beam is employed in a selective, directed write as the stress altering treatment, the masking performed at block 420 can be avoided. Similarly, other suitable stress altering treatments may also be employed that can selectively alter stress of the liner within the NMOS region without altering stress of the liner within the PMOS region. As a result, the liner within the NMOS region induces tensile stress whereas the liner within the PMOS region induces compressive stress.

At block 424, the lithographic coating is removed from the device by a suitable process. A thermal process, such as an anneal, can be performed here (if not incorporated into the treatment process itself) in order to induce the desired stresses into the NMOS and PMOS regions. Subsequently, a pre-metal dielectric (PMD) layer is formed over the device and on the stress inducing liner at block 426, which protects underlying components and transistors from the formed PMD layer and can also act as an etch-stop layer in forming openings for contacts to transistor terminals through the PMD layer. The PMD layer is comprised of a suitable dielectric material, which is deposited followed by a planarization process, such as chemical mechanical planarization (CMP), to planarize a surface of the device.

Subsequently, other features and/or components of the device can be formed. Conductive contacts are formed through the PMD layer and portions of the stress inducing liner to provide electrical connection for the transistor terminals. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels are layers can then be formed to provide electrical interconnection of the various electrical components in the device, wherein each metallization level includes an inter-level or inter-layer (ILD) dielectric formed over a preceding level, with vias and/or trenches formed therein and filled with a conductive material. Other typical back-end processing may be performed including hydrogen sintering and other processes that impact stress induced by the strain inducing liner.

Figure 5A:
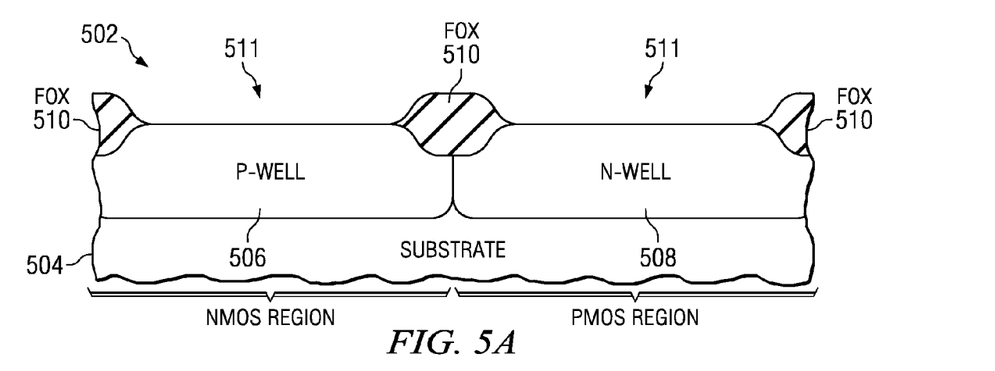
FIGS. 5A-5O are a plurality of fragmentary cross section diagrams illustrating a transistor device being formed in accordance with the present invention by the method of FIG. 4 is provided.
Figure 5B:
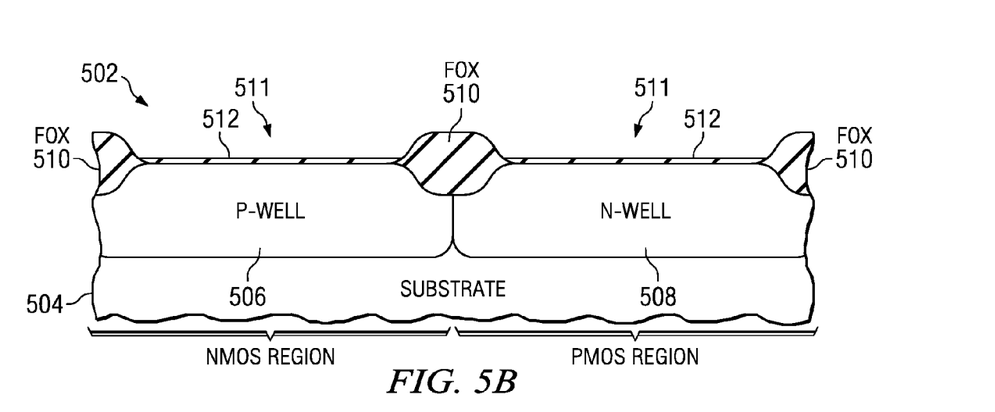
Figure 5C:
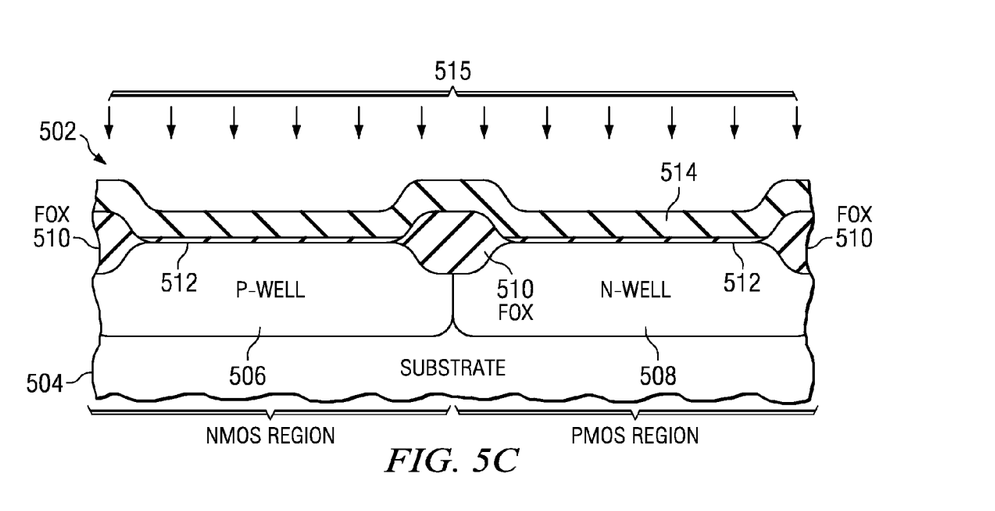
Figure 5D:
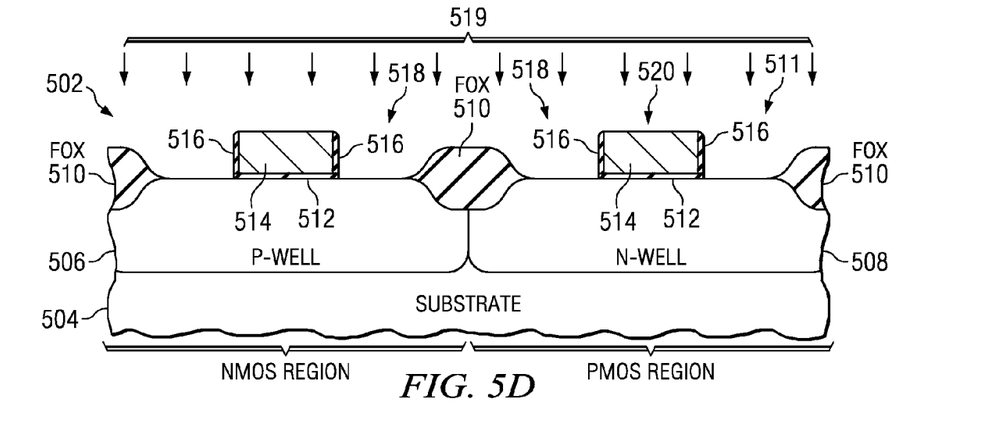
Figure 5E:
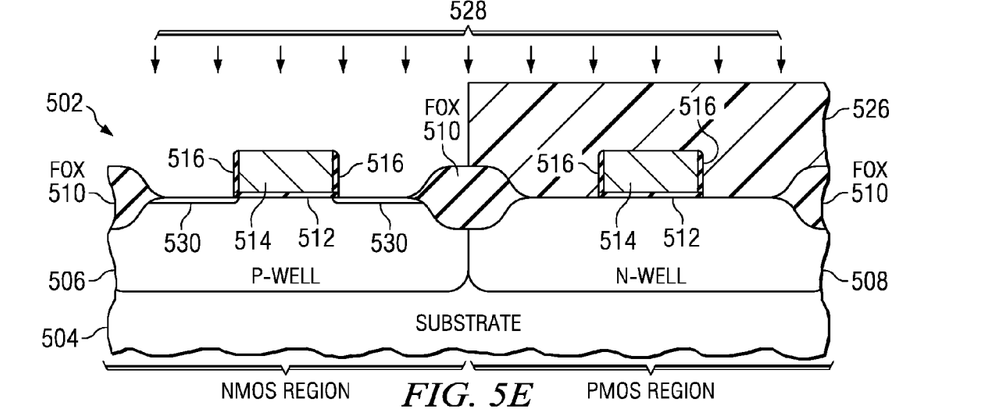
Figure 5F:
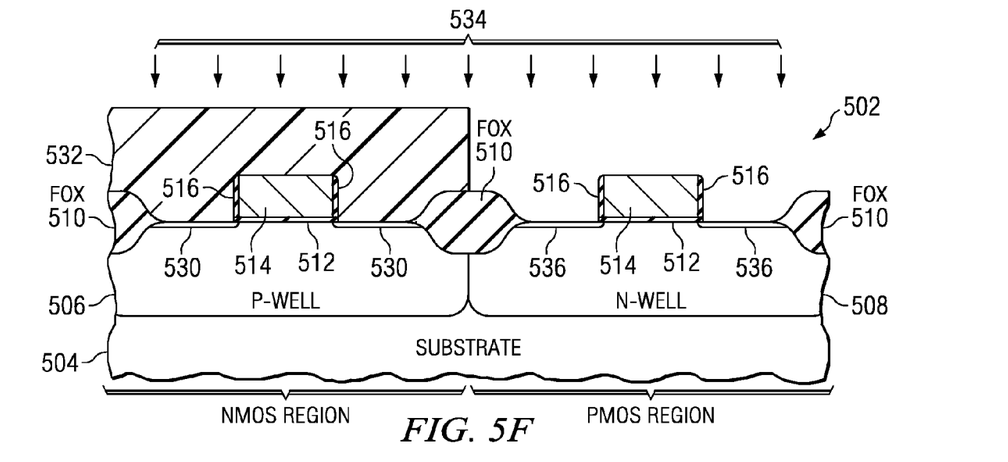
Figure 5G:
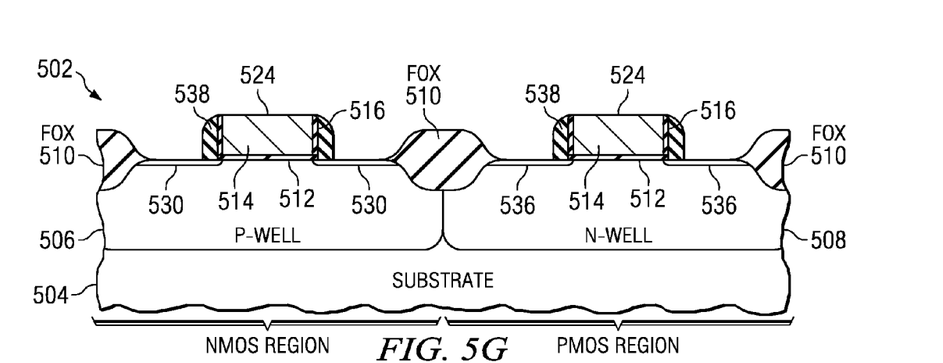
Figure 5H:
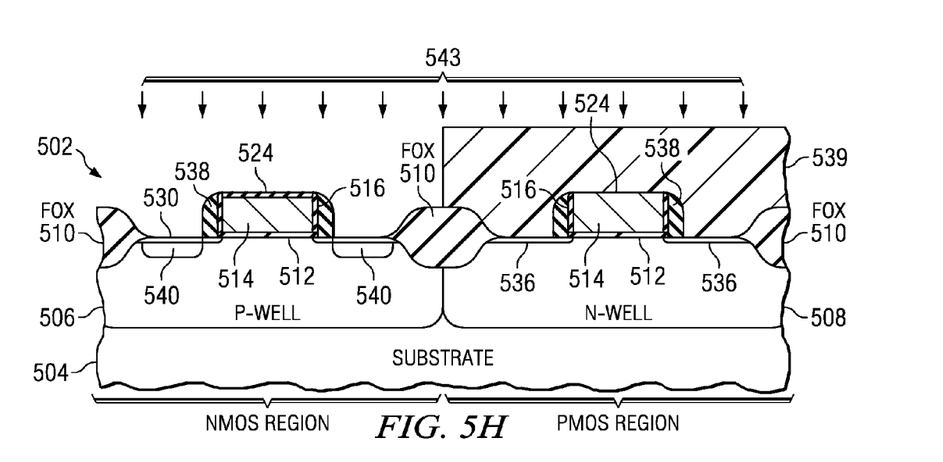
Figure 5I:
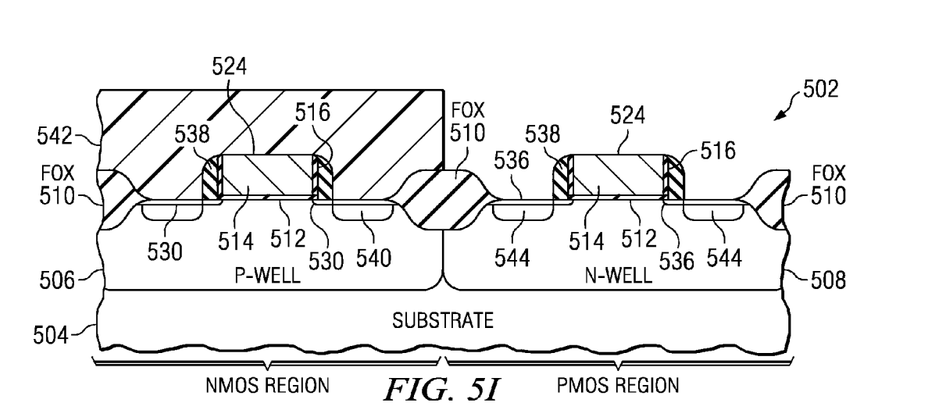
Figure 5J:
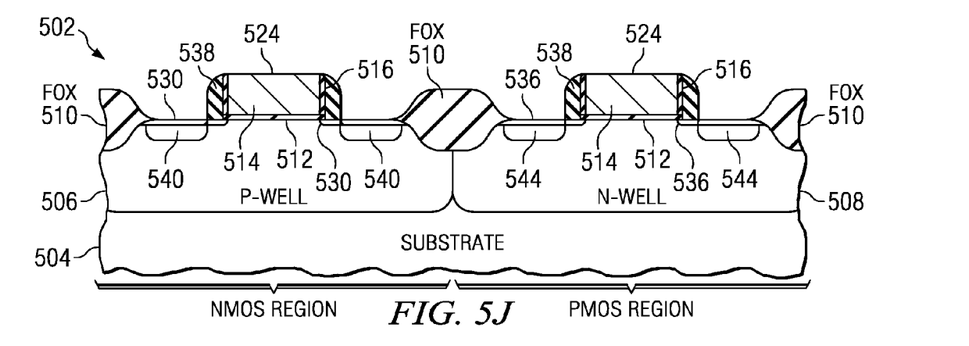
Figure 5K:
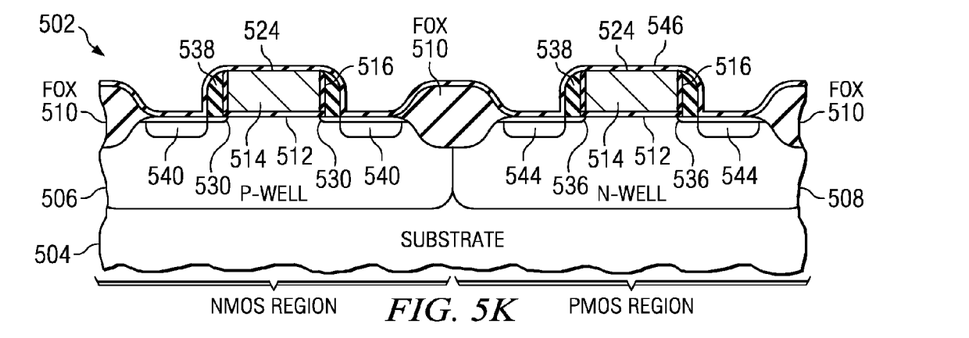
Figure 5L:
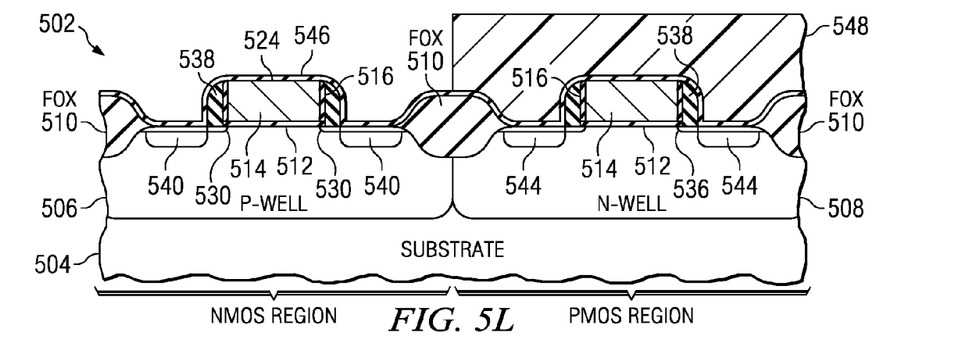
Figure 5M:
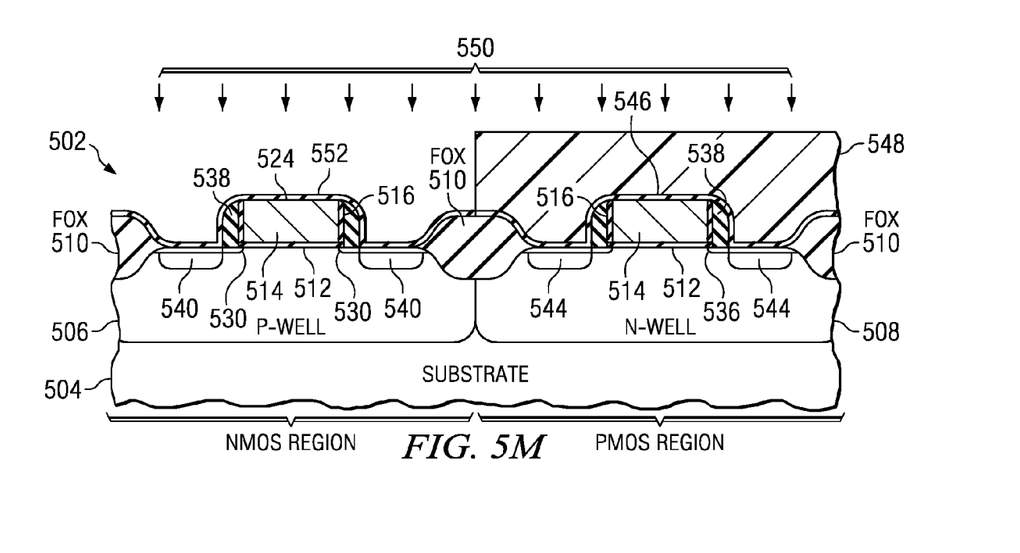
Figure 5N:
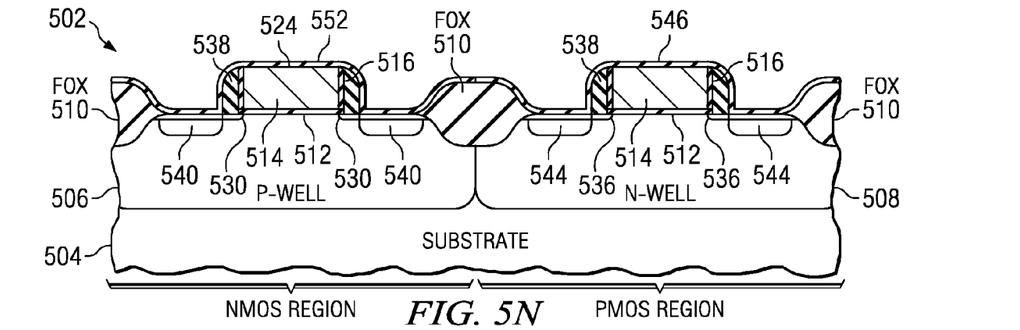
Figure 5O:
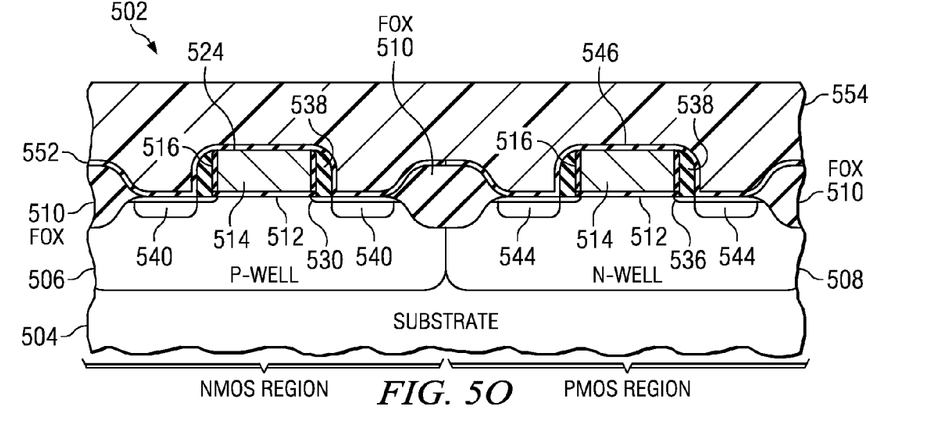

Turning now to FIGS. 5A-5O, a plurality of fragmentary cross section diagrams illustrating a transistor device being formed in accordance with the present invention by the method 400 of FIG. 4 is provided. In FIG. 5A, a transistor device 502 is provided, wherein a semiconductor body 504, such as a semiconductor substrate, has a number of wells formed therein, such as a P-well region 506 to define an NMOS transistor device region and an N-well region 508 to define a PMOS transistor device region, respectively. Further, isolation regions 510 such as STI regions are formed in the semiconductor body to define active area regions 511, as may be appreciated. In FIG. 5B, the transistor device 502 is illustrated, wherein a gate oxide 512 has been formed, for example, by thermally grown $SiO_2$, over the active areas 511.

Referring to FIG. 5C, a conductive gate electrode material (e.g., polysilicon, doped polysilicon, and the like) has been deposited as a gate electrode layer 514 overlying the gate oxide 512. Turning now to FIG. 5D, the gate electrode layer 514 and the gate oxide layer 512 are patterned to form gate structures. Additionally, offset spacers 516 are formed on the lateral edges of the gate structures. The offset spacers 516 are comprised of an insulative material, such as nitride or oxide, and are relatively thin. The offset spacers 516 operate to protect the gate electrodes 514 and to align and define subsequently formed regions.

The PMOS region is then masked, as illustrated in FIG. 5E with a masking material 526 such as photoresist, and an extension region implant 528 is performed to form n-type extension regions 530 in the NMOS region. The n-type extension region mask 526 is then removed and a p-type extension region mask 532 is deposited and patterned to cover the NMOS region, as illustrated in FIG. 5F. A p-type extension region implant process 534 is performed to form p-type extension regions 536 in the PMOS region, as illustrated in FIG. 5F. The mask 532 is then removed and a thermal process such as a rapid thermal anneal is typically performed to activate the implanted dopants, wherein a lateral diffusion of the extension regions 530, 536 under the offset spacers 516 can be achieved.

Sidewall spacers 538 are formed over the offset spacers 516 on the lateral edges of the gate structures as shown in FIG. 5G. To form the sidewall spacers 538, insulating sidewall material(s) are deposited in a generally conformal manner over the device and subsequently subjected to an anisotropic etch to remove the insulating material on top of the gate and over the active areas, leaving sidewall spacers 538 in both the NMOS and PMOS regions, as illustrated in FIG. 5G. Some examples of suitable insulative materials include oxide and nitride.

Source and drain regions 540 are formed in the NMOS region as shown in FIG. 5H. The source and drain regions 540 are formed by a source/drain implant 543 with an NSD mask 539 to implant an n-type dopant in the NMOS region. It is appreciated that variations of these masks can be employed in the present invention to implant n-type dopants. As can be seen in FIG. 5H, the source/drain regions 540 are self-aligned with respect to the sidewall spacers 538, and thus are laterally spaced from the extension regions 530.

FIG. 5I illustrates the device after removal of the NSD mask 539 and also illustrates that the formation of source/drain regions 544 within the PMOS region. A PSD mask 542 is employed to mask the NMOS region and allow formation of the source/drain regions 544 within the PMOS region. FIG. 5J depicts the device after formation of the source/drain regions 544 and removal of the NSD mask 539.

FIG. 5K illustrates a strain inducing liner 546 formed over the device, but untreated. The liner 546 is comprised of one or more layers that induce strain. A composition and thickness of layers comprising the strain inducing liner are selected to attain a desired magnitude and type of strain as well as protect underlying layers/regions of the device. The liner also serves to protect and facilitate formation of a later formed PMD layer. Some examples of suitable strain inducing liner compositions include, silicon nitride (SiN), silicon carbide (SiCN), silicon carbon (SiC), silicon oxy-carbide (SiCO), and the like. The formation of the strain inducing liner can control the magnitude and type of stress produced.

The PMOS region is masked with a lithographic coating 548 whereas the NMOS region is exposed as shown in FIG. 5L. The lithographic coating 548 is typically a photosensitive and developable material that can substantially absorb or reflect electron and/or ultraviolet beams. Suitable lithographic coatings include, for example, photo resist and UV reflective coatings. It is appreciated that alternate methods of the present invention include other coatings selectively formed that block stress inducing treatments.

FIG. 5M shows the device as a stress altering treatment 550 is applied to the NMOS region. The stress altering treatment 550 alters a portion 552 of the liner within the NMOS region causing the stress type and/or magnitude to be altered. The strain inducing liner 546 within the PMOS region is not altered because of the PMOS region being masked. As a result, the liner 552 within the NMOS region induces a first type of stress, generally tensile, whereas the liner 546 within the PMOS region induces a second type of stress, typically compressive. FIG. 5N depicts the device with the altered liner 552 and the unaltered liner portion 546 after removal of the lithographic mask 548. A thermal process, such as an anneal, can be performed to induce the desired stresses into the NMOS and PMOS regions (if not incorporated into the treatment process itself).

FIG. 5O illustrates the device after formation of the PMD layer 554 on the liner 546 and 552, which protects underlying components and transistors from the formed PMD layer 554 and can also act as an etch-stop layer in forming openings for contacts to transistor terminals through the PMD layer 554. The PMD layer 554 is comprised of a suitable dielectric material, which is deposited followed by a planarization process, such as chemical mechanical planarization (CMP), to planarize a surface of the device.

Subsequently, other features and/or components of the device can be formed. Conductive contacts are formed through the PMD layer and portions of the stress inducing liner to provide electrical connection for the transistor terminals. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels are layers can then be formed to provide electrical interconnection of the various electrical components in the device, wherein each metallization level includes an inter-level or inter-layer (ILD) dielectric formed over a preceding level, with vias and/or trenches formed therein and filled with a conductive material. Other typical back-end processing may be performed including hydrogen sintering and other processes that impact stress induced by the strain inducing liner.

It is noted that the semiconductor device depicted in FIGS. 5A to 5O is exemplary in nature and intended to facilitate an understanding of the present invention. It is appreciated that variations in thicknesses, layers formed, dimensions, materials employed, and the like are permitted and contemplated in accordance with the present invention.

While, for purposes of simplicity of explanation, the methodologies of FIGS. 1, 2 and 4 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 6:
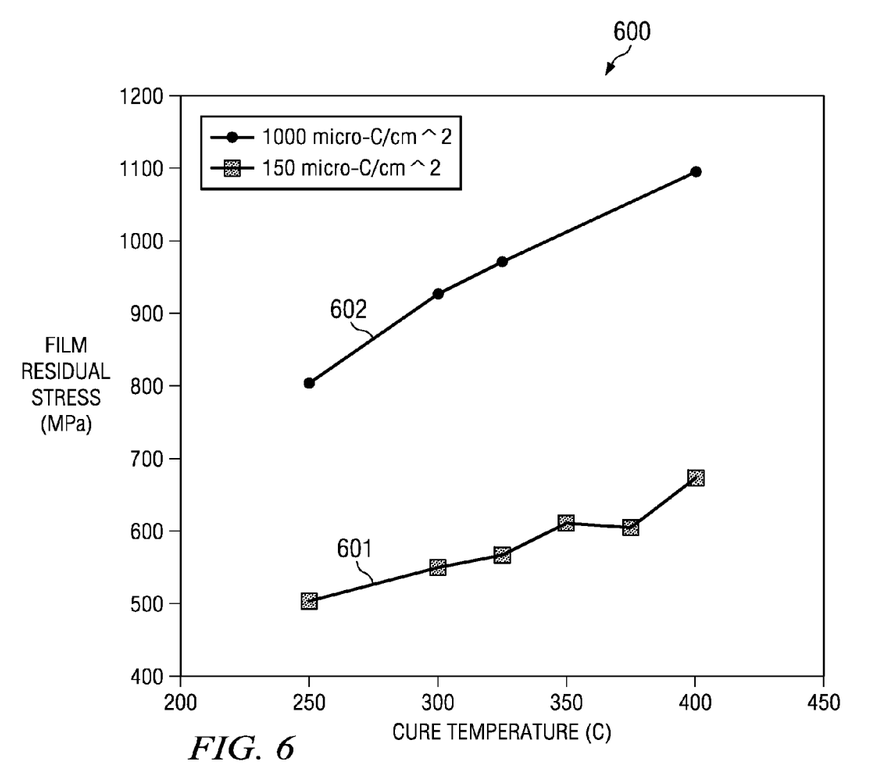
FIG. 6 is a graph illustrating stress obtained according to stress inducing treatments in accordance with an aspect of the present invention.

FIG. 6 is a graph illustrating stress obtained according to stress inducing treatments in accordance with an aspect of the present invention. An x-axis represents cure temperature in degrees Celsius and a y-axis represents induced residual stress in MPa. The cure temperature is the temperature for a thermal process, such as an anneal, performed after forming a strain inducing liner and altering with a electron beam. The strain inducing liner, in this example, is a silicon-nitride based liner and induces a compressive stress if unaltered. However, the graph depicts altered stress inducing liners that have been subjected to stress altering treatments as described above and induce tensile stress.

Line 601 illustrates stress versus cure temperature for a stress inducing liner subjected to an electron beam having a dose of 150 micro-C/cm2. It can be seen that as the cure temperature increases, the magnitude of stress induced increases. Line 602 illustrates stress versus cure temperature for a stress inducing liner subjected to an electron beam having a dose of 1000 micro-C/cm2. Again, it can be seen that as the cure temperature increases, the magnitude of stress induced increases. Also, it is noted that the higher dose results in higher induces stress.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising:
    performing well formation and isolation processing in a semiconductor body;
    forming a gate oxide layer on the semiconductor body;
    forming gate electrodes on the gate oxide layer;
    forming offset spacers on lateral edges of the gate electrodes;
    forming extension regions in the semiconductor body in NMOS and PMOS regions;
    forming sidewall spacers adjacent the offset spacers;
    implanting n-type dopant(s) to form source/drain regions in the NMOS region;
    implanting p-type dopant(s) to form source/drain regions in the PMOS region;
    forming a strain inducing liner over the device;
    masking the PMOS region with a lithographic coating and exposing the NMOS region; and
    exposing one of an ultraviolet beam and an electron beam to strain inducing liner formed over the NMOS region with a dose and duration that obtains a stress type and magnitude within the NMOS region.

2. The method of claim 1, further comprising removing the lithographic coating after applying the stress altering treatment.

3. The method of claim 1, further comprising forming a PMD layer on the strain inducing liner.

4. The method of claim 1, wherein forming the strain inducing liner comprises forming a compressive stress inducing silicon nitride based liner with a plasma enhanced chemical vapor deposition process at a temperature of about 300 degrees Celsius, a pressure of about 2.0 torr, a $SiH_4$ flow of about 20 sccm, an $NH_3$ flow of about 500 sccm, an $N_2$ flow of about 2000 sccm, a high frequency RF power of about 20 watts, and a lower frequency RF power of about 50 watts.

5. The method of claim 1, wherein masking the PMOS region with a lithographic coating comprises depositing a layer of photo resist and selectively removing a portion of the resist from the NMOS region.

6. A method comprising:
    forming a first transistor in a first region of a substrate and a second transistor in a second region of the substrate;
    forming a strain inducing liner over the first and second regions;
    forming a blocking layer over one of the first and second regions so as to have an blocked region and an unblocked region; and
    exposing the first and second regions to one of one of an ultraviolet beam and an electron beam with a dose and duration that obtains a stress type and magnitude within the unblocked region;
    removing the blocking layer; and
    forming a PMD layer on the strain inducing liner after the blocking layer has been removed.

7. The method of claim 6, wherein the step of forming the strain inducing liner over the first and second regions further comprises forming a compressive stress inducing silicon nitride based liner with a plasma enhanced chemical vapor deposition process at a temperature of about 300 degrees Celsius, a pressure of about 2.0 torr, a $SiH_4$ flow of about 20 sccm, an $NH_3$ flow of about 500 sccm, an $N_2$ flow of about 2000 sccm, a high frequency RF power of about 20 watts and a lower frequency RF power of about 50 watts.

8. The method of claim 6, wherein the first transistor is an NMOS transistor and the second transistor is a PMOS transistor.

9. The method of claim 8, wherein the step of forming the first transistor in the first region of the substrate and the second transistor in the second region of the substrate further comprises:
    forming a first gate electrode over a P-type well in the first region and a second gate electrode over an N-type well in the second region;
    forming extension regions in each of the first and second regions; and
    forming source/drain regions in each of the first and second regions.

* * * * *